(12) United States Patent
Ballantyne (10) Patent No.: US 7,440,530 B1
(45) Date of Patent: Oct. 21, 2008

(54) CIRCUIT FOR AND METHOD OF OPTIMIZING THE TRANSMISSION OF DATA ON A COMMUNICATION CHANNEL

(75) Inventor: Richard S. Ballantyne, Stittsville (CA)

(73) Assignee: Xilinx, Inc., San Jose, CA (US)

( * ) Notice: Subject to any disclaimer, the term of this patent is extended or adjusted under 35 U.S.C. 154(b) by 635 days.

(21) Appl. No.: 10/871,086

(22) Filed: Jun. 18, 2004

(51) Int. Cl.
*H04L 7/00* (2006.01)

(52) U.S. Cl. ............... 375/358; 375/219; 375/259; 340/870.01; 381/108; 455/24; 455/39; 455/69

(58) Field of Classification Search ............ 375/358, 375/354, 377, 259, 295, 316; 340/870.01, 340/870.4, 870.42; 381/104, 107, 108; 455/7, 455/24, 39, 68, 69
See application file for complete search history.

(56) References Cited

U.S. PATENT DOCUMENTS

| | | | |
|---|---|---|---|
| 6,016,086 A | 1/2000 | Williamson et al. | |
| 6,542,555 B2 | 4/2003 | Dally | |
| 6,563,831 B1 | 5/2003 | Dally et al. | |
| 6,570,406 B2* | 5/2003 | Tang et al. | 326/86 |
| 6,597,198 B2 | 7/2003 | Haycock et al. | |
| 6,606,656 B2 | 8/2003 | Carvey et al. | |
| 6,639,426 B2 | 10/2003 | Haycock et al. | |
| 7,184,713 B2* | 2/2007 | Kadous et al. | 455/67.13 |
| 7,227,908 B2* | 6/2007 | Suzuki et al. | 375/296 |
| 2002/0016901 A1 | 2/2002 | Carvey et al. | |
| 2002/0147953 A1* | 10/2002 | Catreux et al. | 714/746 |
| 2004/0015765 A1 | 1/2004 | Cooper et al. | |

OTHER PUBLICATIONS

U.S. Appl. No. 10/660,062, filed Sep. 11, 2003, Groen et al.
U.S. Appl. No. 10/661,016, filed Sep. 11, 2003, Groen et al.
Li-Shiuan Peh et al.; "A Delay Model for Router Microarchitectures"; 2001 IEEE; Jan.-Feb. 2001; p. 26-34.
Ellen Spertus et al.; "Evaluating the Locality Benefits of Active Messages"; PPOPP '95 Santa Clara; 1995 ACM; pp. 189-198.
William J. Dally; "Virtual-Channel Flow Control"; IEEE Transactions on Parallel and Distributed Systems, vol. 3, No. 2; Mar. 1992; 1992 IEEE; pp. 194-205.
Stuart Fiske et al.; "Thread Prioritization: A tread scheduling Mechanism for Multiple-Context Parallel Processors"; Copyright 1995; FGCS—Future Generation Computer Systems; pp. 503-518.

* cited by examiner

*Primary Examiner*—Temesghen Ghebretinsae
(74) *Attorney, Agent, or Firm*—John J. King; Justin Liu (57) ABSTRACT

A circuit for optimizing the transmission of data on a communication channel is disclosed. According to one embodiment of the invention, a circuit comprises a transmitter circuit having a programmable output characteristic and being coupled to a transmission media. The transmission media receives serial data from the transmitter circuit and couples the data to a receiver circuit by way of the transmission media. A signal quality monitor associated with the receiver circuit generates received signal quality data. Finally, a feedback path couples the received signal quality data to the transmitter circuit.

31 Claims, 7 Drawing Sheets

CIRCUIT FOR AND METHOD OF OPTIMIZING THE TRANSMISSION OF DATA ON A COMMUNICATION CHANNEL

FIELD OF THE INVENTION

The present invention relates generally to data communications, and in particular, to a circuit for and method of optimizing the transmission of data on a communication channel.

BACKGROUND OF THE INVENTION

The transfer of data between cards on a backplane is often required in a digital system design. Transferring data by way of a serial communications channel makes greater use of the available resources, such as the number of pins used to transfer data. For example, a system processing 64 bits of data at 80 MHz can use a 64-bit data link to another circuit or across a backplane. This same data can be transmitted serially over 16 lines single data rate (SDR) at 320 MHz, producing a 75% pin savings. Alternatively, the data can be serialized to eight differential pairs (i.e. still using 16 lines) running at 320 MHz double data rate (DDR) (640 Mb/s). This also produces a pin savings of 75% with greater signal integrity and lower power. However, one important factor in transmitting serial data is to enable the clock and data recovery circuitry to operate effectively.

A system designer providing low speed signals and single ended signals must consider signal undershoot and overshoot in order to maximize the signal integrity. However, high speed signals and differential signals provided in serial data communication require a different type of optimization. The "eye diagram" of the received signal, which may only be a few millivolts, must be optimized for "openness" in order for the clock and data recovery circuitry to operate effectively. The openness of the eye diagram is affected by a number of factors, such as signaling speed, transmission media (e.g. cable type, printed circuit board substrate material, transmission length, etc.), transmitter pre-emphasis, receiver equalization, transmission line type (e.g. microstrip, stripline, buried microstrip, simple stackup, cable type, etc.). However, some of these factors may not be known to the system designer in advance, and/or may change over time.

The optimization of the eye diagram of a received signal may be accomplished through the use of expensive simulation tools that simulate the received signal at the input pins of the receiver. However, such a simulation would require the system designer to consider all possible transmission scenarios, and determine the proper channel optimization settings for each scenario in advance. For example, if a backplane transmission media is used, the system designer would have to consider all possible combinations of transmitter and receiver slots, as well as the different lengths, or types of transmission cable.

Accordingly, this analysis would be a considerable burden for the system designer. Further, while the system designer would prefer to optimize the channel characteristics inside the clock/data recovery circuit, the system designer does not have visibility internal to the receiver.

Accordingly, there is a need for an improved circuit for transmitting serial data and method of optimizing the transmission of data on a serial communication channel.

SUMMARY OF THE INVENTION

A circuit for optimizing the transmission of data on a communication channel is disclosed. According to one embodiment of the invention, a circuit comprises a transmitter circuit having a programmable output characteristic and being coupled to a transmission media. The transmission media receives serial data from the transmitter circuit and couples the data to a receiver. A signal quality monitor associated with the receiver generates received quality signal data, and couples the received signal quality data to the transmitter circuit by way of a feedback path. According to other aspects of the invention, a bi-directional data transmission media is provided between the transmitter circuit and the receiver circuit. A second signal quality monitor may also be associated with the transmitter circuit. Also, programmable input characteristics at the receiver circuit may be altered to optimize the transmission of data.

A method of optimizing the transmission of data serial on a communication channel is also disclosed. The method comprises steps of transmitting data from a transmitter circuit to a receiver by way of a serial data connection; calculating a signal quality value for the transmission of the data; coupling the signal quality value from the receiver circuit to the transmitter circuit by way of a second data connection; and altering the output characteristics of the transmitter circuit based upon the signal quality value. Methods of transmitting data employing a bidirectional data transmission media, altering both output characteristics of a transmitter circuit and input characteristics of a receiver circuit, and using multiple signal quality monitors are also disclosed.

DETAILED DESCRIPTION OF THE DRAWINGS

Figure 1:
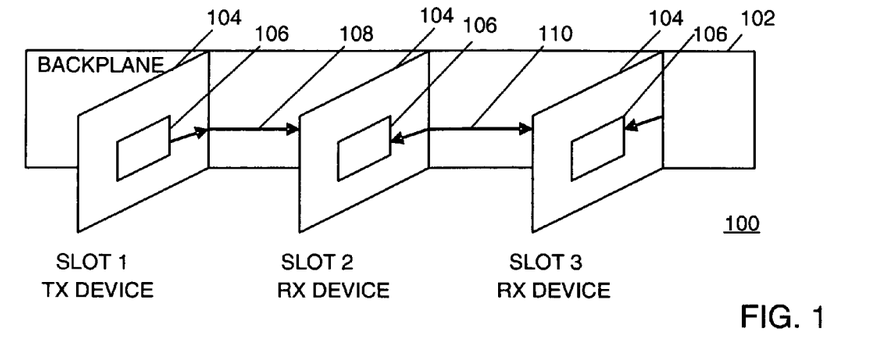
FIG. 1 is a block diagram of a system employing a circuit or method according to an embodiment of the present invention.

Turning first to FIG. 1, a block diagram of a system 100 employing a circuit or method according to an embodiment of the present invention is shown. In particular, a backplane 102 is adapted to receive a plurality of printed circuit boards (PCBs) 104. The printed circuit boards preferably comprise a plurality of integrated circuits 106, which could comprise a programmable logic device such as a field programmable gate array (FPGA) or a complex programmable logic device (CPLD), or an application specific integrated circuit (ASIC). The integrated circuits on the printed circuit board could be coupled to the backplane and/or other printed circuit boards coupled to the backplane by way of transmission media, such as a transmission media 108, or a bi-directional transition media 110. Transmission of data between elements of the system 100 could vary depending upon a number of factors related to the transmission media, as described above. As will be described in more detail in reference to the remaining figures, data can be transmitted between integrated circuit 106 and the backplane and/or another integrated circuit on a separate printed circuit board. Although a single backplane is shown, the embodiments of the present invention could also apply to a plurality of backplanes 102 coupled to one another on a rack, or coupled to one another on separate racks.

Figure 2:
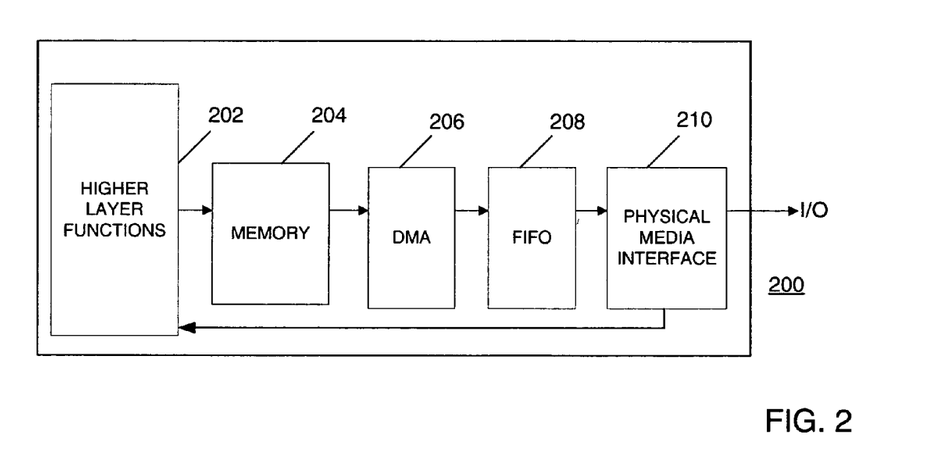
FIG. 2 is a block diagram of an integrated circuit according to an embodiment of the present invention.
Figure 3:
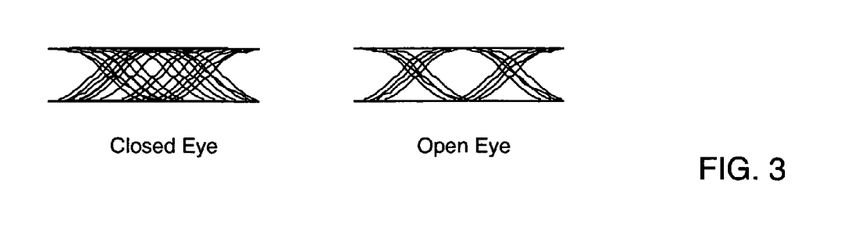
FIG. 3 is a conventional eye diagram of a received signal.

Turning now to FIG. 2, a block diagram of an integrated circuit according to an embodiment of the present invention is shown. In particular, an integrated circuit 200, which could be a programmable logic circuit or an ASIC, comprises a high layer function block 202 having conventional functions of the circuit and is coupled to a memory 204. The memory 204 is coupled to and accessible by a direct memory access (DMA) block 206. Generally, the high layer functions block 202 provides control signals, such as read and write requests to a FIFO 208. The FIFO 208 provides data alignment for high-speed data output, as will be described in more detail below. Finally, the data could be provided to a physical media interface 210, for example, which couples data to an input/output (I/O) port. As will be described in more detail in reference to the remaining figures, the circuits and methods of the embodiments of the present invention will produce a received signal having an improved open eye, as shown in FIG. 3.

Figure 4:
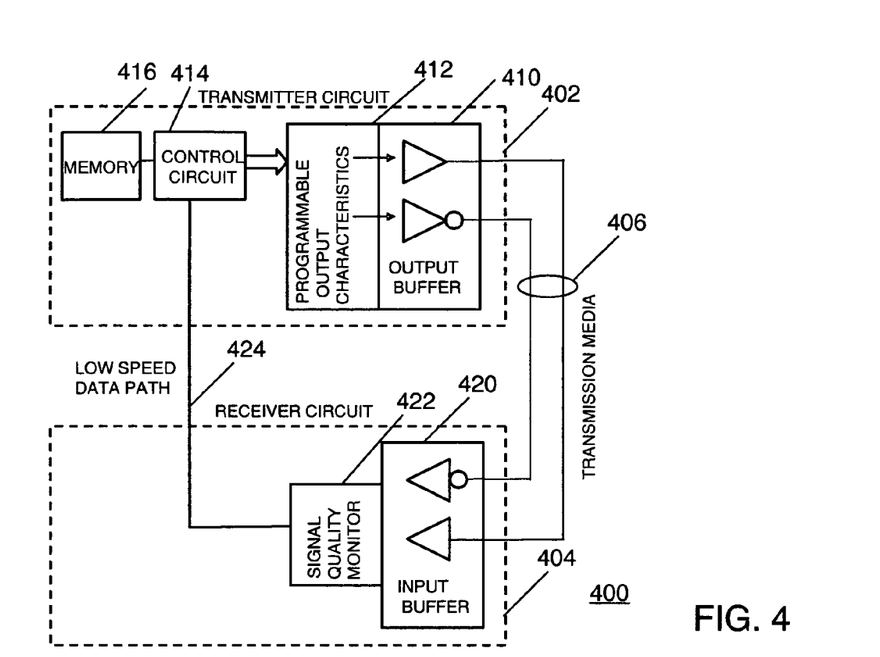
FIG. 4 is a block diagram of a transmitter circuit and a receiver circuit having a signal quality monitor and a feedback path according to an embodiment of the present invention.

Turning now to FIG. 4, a block diagram of a transmitter circuit and a receiver circuit having a signal quality monitor and a feedback path according to an embodiment of the present invention is shown. In particular, the system 400 comprises a transmitter circuit 402 coupled to a receiver circuit 404 by a transmission media 406 which is preferably a serial communication channel. The transmitter circuit 402 comprises an output buffer 410 having a plurality of programmable output characteristics 412 (an example of a programmable line driver in a programmable transmit module can be found in U.S. patent application Ser. No. 10/661,016, entitled "Programmable Logic Device Including Programmable Multi-Gigabit Transceivers", filed Sep. 11, 2003 and U.S. patent application Ser. No. 10/660,062, entitled "DAC Based Driver with Selectable Pre-Emphasis Signal Levels", filed Sep. 11, 2003, both of which are herein incorporated by reference). A control circuit 414 is coupled to control the programmable output characteristics. That is, the control circuit alters the programmable output characteristics to optimize the transmission of data from the output buffer to improve the signal quality of the received data.

A memory 416 is also coupled to the control circuit 414. The memory 416 preferable retains information regarding desirable configurations for the programmable output characteristics. For example, the memory could store output characteristics based upon known configurations, and could include historical information related to various configurations. The memory would also preferably store settings for various adjustable output configurations, which could include, for example, an output voltage, rise and fall times of the output signal, and pre-emphasis of the output signal. Such settings could include ranges for various adjustable configurations, as well as combinations of predetermined adjustable configurations. The control circuit could be, for example, a microprocessor or other dedicated processing circuit, or could be implemented as a hardware state machine. Also, while the memory is shown separate from the control circuit, the memory could be incorporated in the control circuit.

The receiver circuit 404 comprises an input buffer 420 which is coupled to a signal quality monitor 422. The signal quality monitor determines the signal quality of the data received from the output buffer 410 by way of the transmission media 406. The signal quality monitor could be, for example, a circuit for detecting bit error rate, eye diagram data quality, lost packets or colossal failure. The signal quality data is provided from the signal quality monitor 422 by way of a feedback path 424 comprising a second communication channel. The feedback path could be, for example, a low speed data path between the signal quality monitor and the control circuit. Alternatively, the signal quality data could be provided from the receiver circuit 404 to the transmitter circuit 402 by way of the transmission media 406. Although FIG. 4 and the remaining figures describe serial communication channels, the embodiments of the present invention could be employed in a system for transmitting data having a parallel data bus, where a parallel data bus comprises a plurality of serial connections.

Figure 5:
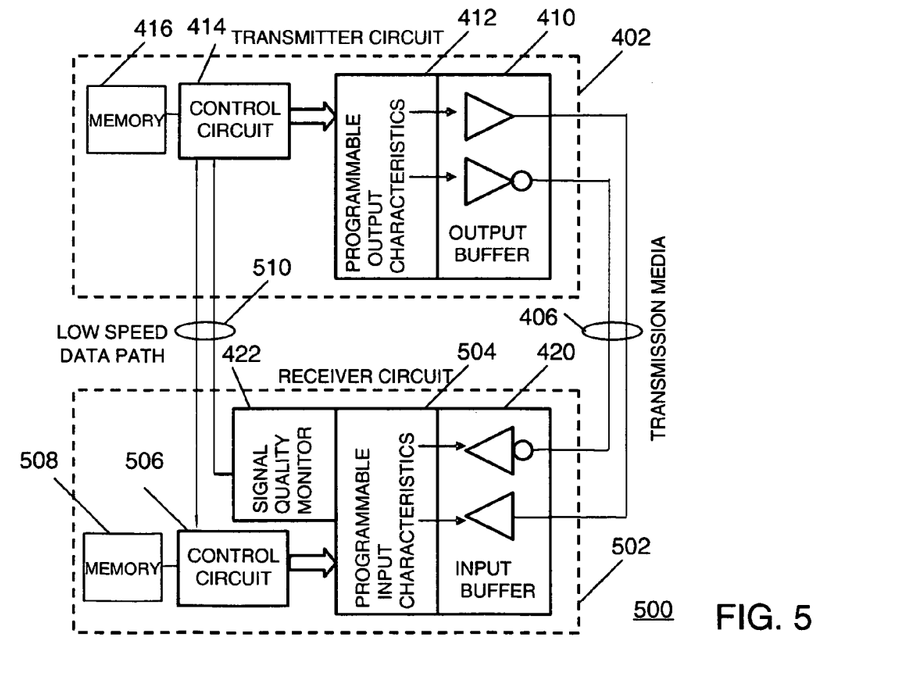
FIG. 5 is a block diagram of a transmitter circuit and a receiver circuit having a signal quality monitor and programmable input characteristics according to an embodiment of the present invention.

Turning now to FIG. 5, a block diagram of a transmitter circuit and a receiver circuit having a signal quality monitor and programmable input characteristics according to the present invention is shown. In particular, the system 500 comprises a receiver circuit 502 having programmable input characteristics 504. Also, separate control circuit 506 associated with the receiver circuit 502 is coupled to the programmable input characteristics. Finally, a memory 508 is also coupled to the control circuit 506. The memory 508 enables the application of predetermined input characteristics to the input buffer. The programmable input characteristics could be, for example, voltage threshold control, variable equalization, filtering, etc. The memory 508 could also store input configurations based upon known configurations or historical data. The control circuit and memory could also be replaced by a hardware state machine. Although a transmitter circuit and receiver circuit are shown in the embodiments of FIGS. 4 and 5, both the transmitter circuit and the receiver circuit could each be a transceiver. That is, while having the functionality of a transmitter, the transmitter circuit could also have the functionality of a receiver. Similarly, the receiver circuit, while having the functionality of a receiver, could also function as a transmitter.

Figure 6:
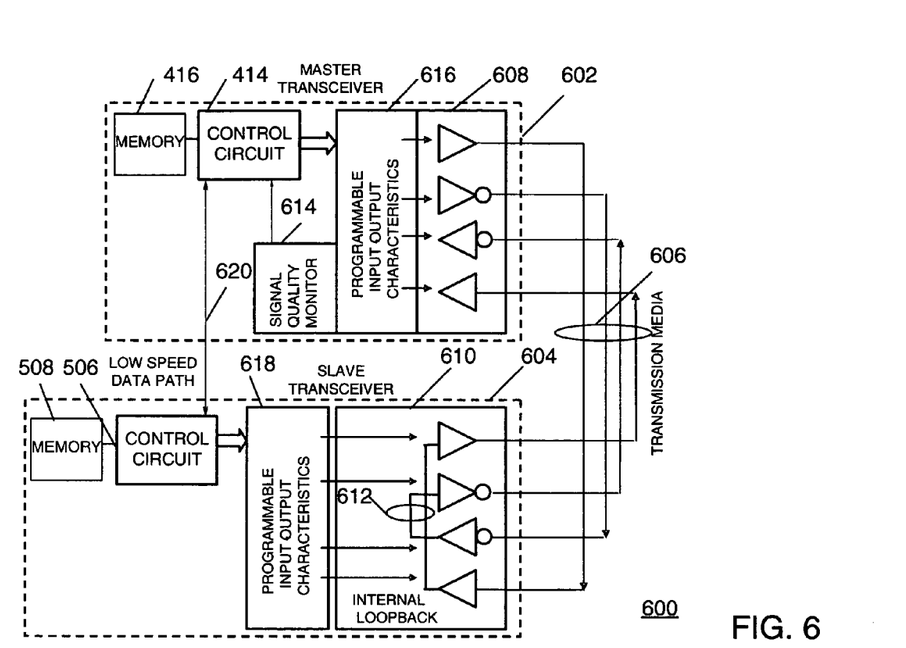
FIG. 6 is a block diagram of a master transceiver having a signal quality monitor and a slave transceiver coupled by a bi-directional transmission media according to an embodiment of the present invention.

Turning now to FIG. 6, a block diagram of a master transceiver having a signal quality monitor and a slave transceiver coupled by a bi-directional transmission media according to the present invention is shown. In particular, the system 600 comprises a master transceiver 602 coupled to a slave transceiver 604 by way of a transmission media 606. The transmission media 606 preferably comprises a bi-directional transmission media which provides data between the master transceiver and slave transceiver by way of the same path. Accordingly, the transmission characteristics of the path from the master transceiver to the slave transceiver and the path from the slave transceiver to the master transceiver should be the same. The master transceiver comprises an input/output buffer 608 coupled to an input/output buffer 610 of the slave transceiver by way of the bi-directional transmission media. The input/output buffer 610 comprises an internal loopback 612 which provides data received at the slave transceiver 604 back to the master transceiver 602 by way of the transmission media 606 comprising a bi-directional serial communication channel. Because the master transceiver 602 comprises a signal quality monitor 614 which is coupled to the control circuit 414, the control circuit can control programmable input/output characteristics 616 of the input/output buffer 608. That is, the signal quality monitor can detect the quality of data transmitted from the master transceiver to the slave transceiver at the master transceiver by way of the internal loopback of the slave transceiver. Accordingly, the control circuit can program the output characteristics of the input/output buffer 608 to optimize the transmission of the output signals.

Similarly, the signal quality monitor can also detect the quality of signals transmitted by the slave transceiver and received by the master transceiver, and therefore alter the programmable input characteristics of the input/output buffer 608 to optimize the reception of data at the input/output buffer 608. Although a single slave transceiver 604 is shown, a plurality of slave transceivers could be coupled to and controlled by the master transceiver 602. According to one aspect of the invention, the master transceiver 602 will provide the settings of the input and output characteristics for the slave transceiver based upon signal quality measurements in the master transceiver, such as by way of a feedback path 620.

Figure 7:
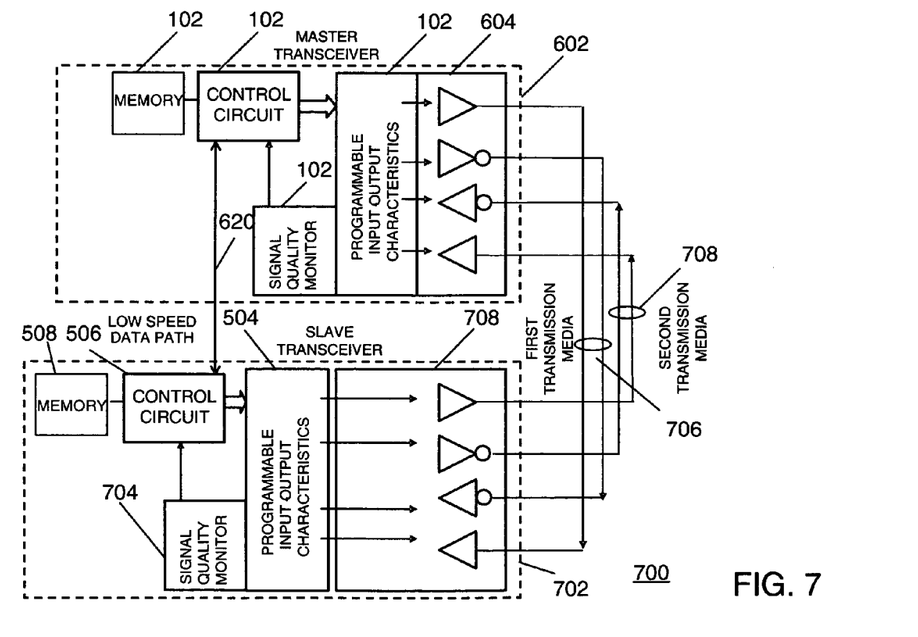
FIG. 7 is a block diagram of a master transceiver having a first signal quality monitor and a slave transceiver having a second signal quality monitor coupled by a first transmission media and a second transmission media according to an embodiment of the present invention.

Turning now to FIG. 7, a block diagram of a master transceiver having a first signal quality monitor and a slave transceiver having a second signal quality monitor coupled by a first transmission media and a second transmission media according to an embodiment of the present invention is shown. In particular, the embodiment of FIG. 7 comprises a slave transceiver 702 having a separate signal quality monitor 704. Also, the master transceiver and the slave transceiver are coupled by separate transmission media comprising a first transmission media 706 and second transmission media 708, each of which are bi-directional serial communication channels. The separate transmission media enable the transfer of data from the master transceiver to the slave transceiver by way of the first transmission media 706, and the transmission of data from the slave transceiver to the master transceiver by way of the second transmission media 708. The control circuits of the master transceiver and the slave transceiver are preferably coupled by way of the feedback path 620, such as a low speed data path. Control circuit 102 of the master transceiver can communicate with the control circuit 506 of the slave transceiver to provide necessary information regarding received signal quality of the signals received at the respective transceivers without a loopback circuit in the slave transceiver. It should be noted that the transmitters, receivers or transceivers of FIGS. 4-7 each could be implemented in an integrated circuit, such as the integrated circuit of FIG. 2.

Figure 8:
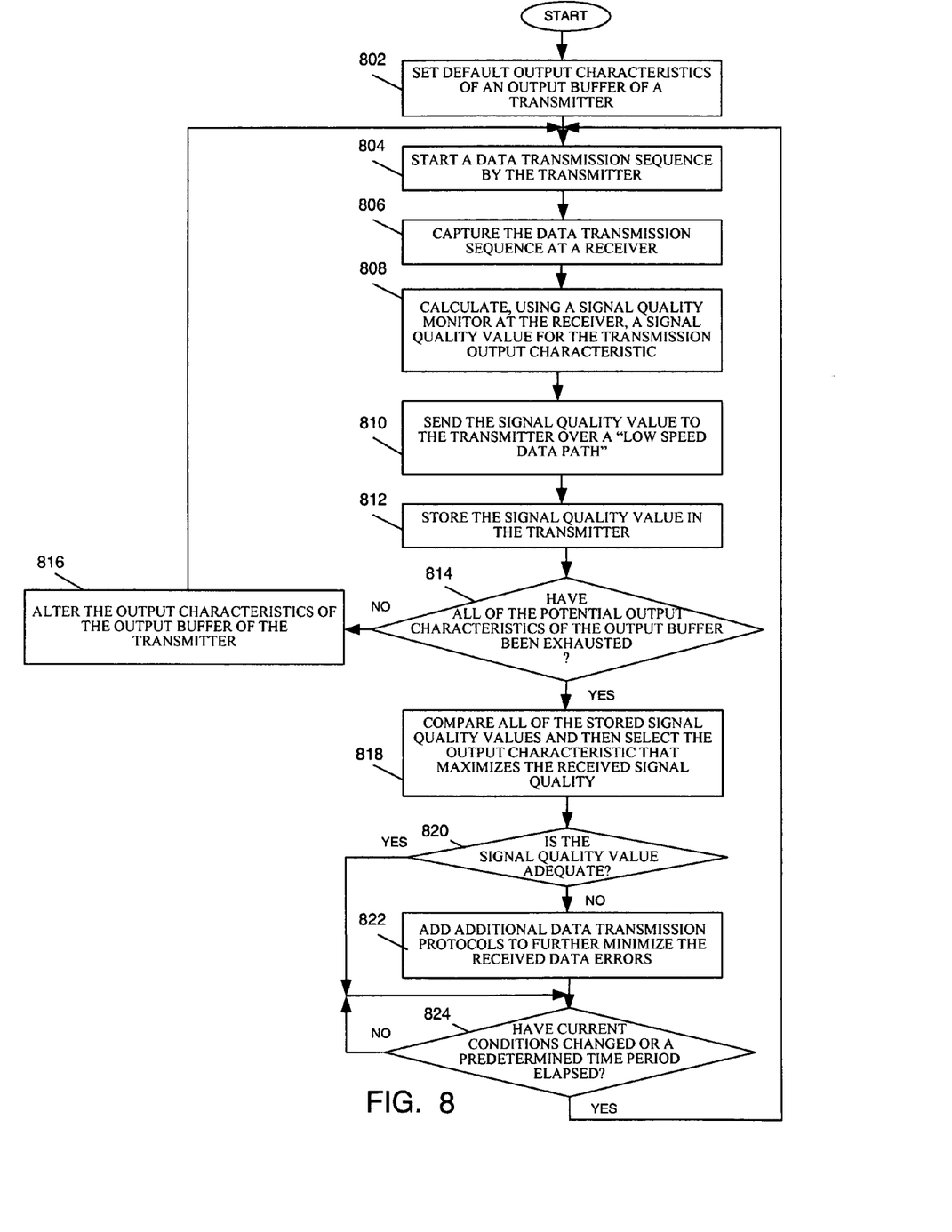
FIG. 8 is a flow chart showing a method of transmitting data by altering output transmission characteristics of a transmitter according to an embodiment of the present invention.

Turning now to FIG. 8, a flow chart shows a method of transmitting data by altering output transmission characteristics of a transmitter according to an embodiment of the present invention. The method of FIG. 8 could use any embodiment described in reference to FIGS. 4-7, or any other suitable circuit. In particular, default output characteristics of an output buffer of a transmitter are set at a step 802. A data transmission sequence is started by the transmitter at a step 804. The data transmission sequence is then captured at a receiver at a step 806. A signal quality monitor is then used at the receiver to calculate a signal quality value for the transmission output characteristic at a step 808. The signal quality value is then sent to the transmitter. The signal quality data is preferably sent over a feedback path, such as a separate low speed data path between the receiver and the transmitter, at a step 810. The signal quality value is then stored in the transmitter at a step 812.

It is then determined whether all of the potential output characteristics of the output buffer have been exhausted at a step 814. If not, the output characteristics of the output buffer of the transmitter are altered at a step 816. If the output characteristics have been exhausted, all of the stored signal quality values are compared, and the output characteristic or characteristics that maximize the received signal quality are then selected at a step 818. It is then determined whether the signal quality value is adequate at a step 820. If not, additional data transmission protocols, such as forward error correction, may be added to further minimize the received data errors at a step 822. Finally, it is determined whether current conditions have changed or a predetermined time period has elapsed at a step 824. If current conditions are known to have changed, it would be beneficial to recalculate a signal quality value and select output characteristics that maximize the received signal quality. Alternatively, if a predetermined amount of time has elapsed, it may also be beneficial to recalculate a signal quality value and select output characteristics that currently maximize the received signal quality. Accordingly, the steps of setting output characteristics of the transmitter could be performed during initial power up of a system comprising a transmitter circuit and a receiver circuit, or periodically if desired.

Figure 9:
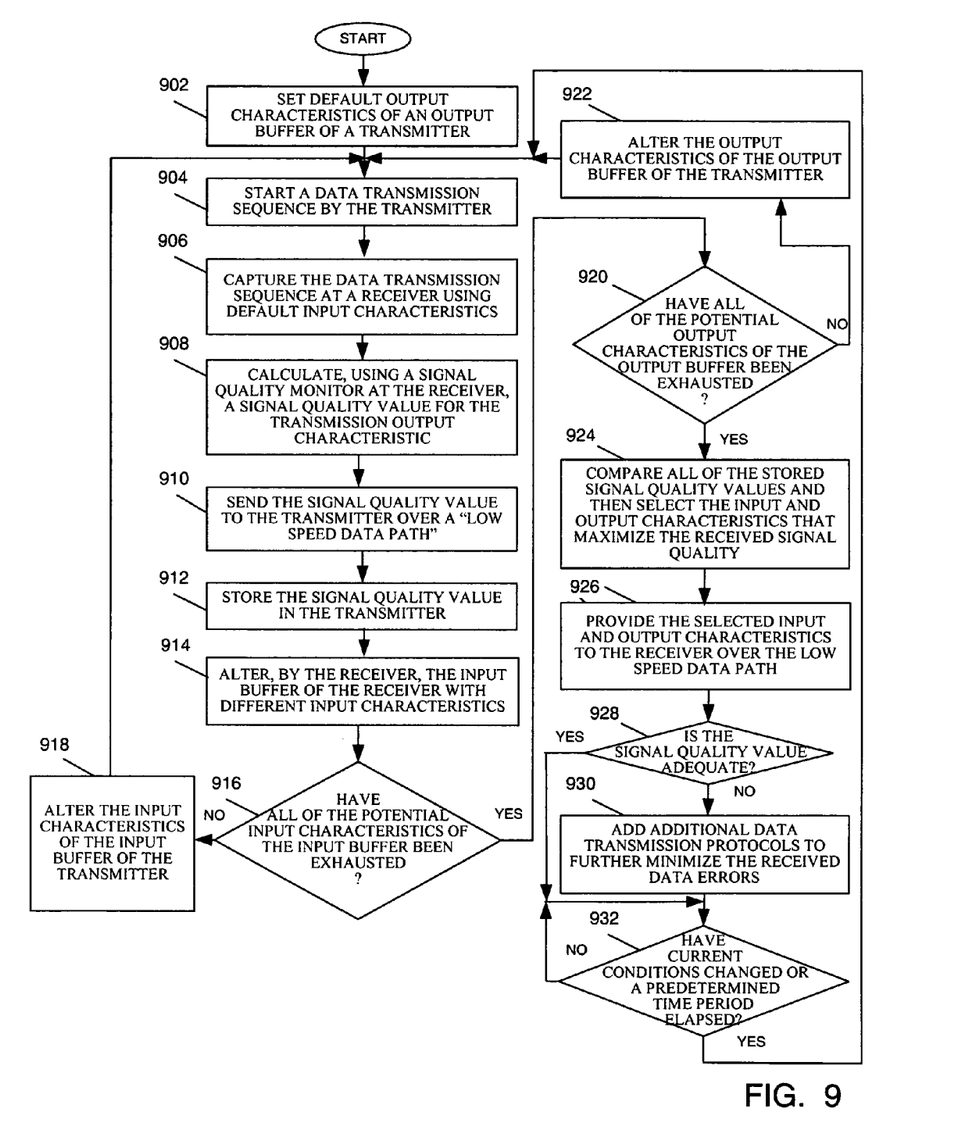
FIG. 9 is a flow chart showing a method of transmitting data by altering input characteristics of a receiver and output characteristics of a transmitter according to an embodiment of the present invention.

Turning now to FIG. 9, a flow chart shows a method of transmitting data by altering input transmission characteristics of a receiver and output transmission characteristics of a transmitter according to an embodiment of the present invention. Although the method of FIG. 9 can be employed in any suitable circuit, the method of FIG. 9 finds particular application with the embodiments of FIGS. 5-7 which include programmable input characteristics of a receiver. In particular, default output characteristics of an output buffer of a transmitter are set at a step 902. A data transmission sequence is started at the transmitter at a step 904. The data transmission sequence is captured at a receiver using default input characteristics at a step 906. A signal quality value, using a signal quality monitor, is calculated for the transmission at a step 908. The signal quality value is sent to the transmitter over a feedback path, such as a low speed data path between the transmitter and the receiver, at a step 910. The signal quality value is stored in the transmitter at a step 912. The input characteristics of the buffer of the receiver are then altered by the receiver at a step 914.

It is then determined whether all of the potential input characteristics of the input buffer have been exhausted at a step 916. If not, the input characteristics of the input buffer of the transmitter are altered at a step 918. It is then determined if all of the potential output characteristics been exhausted at a step 920. If not, the output characteristics of the output buffer of the transmitter are altered at a step 922 and a data transmission sequence is started by the transmitter at a step 904. Otherwise, all of the stored signal quality values are compared and then the combination of input and output characteristics that maximizes the received signal quality is selected at a step 924. The selected input and output characteristics are provided to the receiver over the feedback path at a step 926. In a master slave arrangement, where data is transmitted between the transmitter and receiver circuits over the same transmission media, the input and output characteristics of the slave transceiver may be set to match the characteristics of the master transceiver. It is then determined whether the signal quality value is adequate at a step 928. If not, additional data transmission protocols, such as forward error correction, could be added to further minimize the received data errors at a step 930. Finally, it is determined whether current conditions changed or a predetermined time period elapsed at a step 932. If conditions have changed or a predetermined period has lapsed, the input and output characteristics will be re-evaluated.

Figure 10:
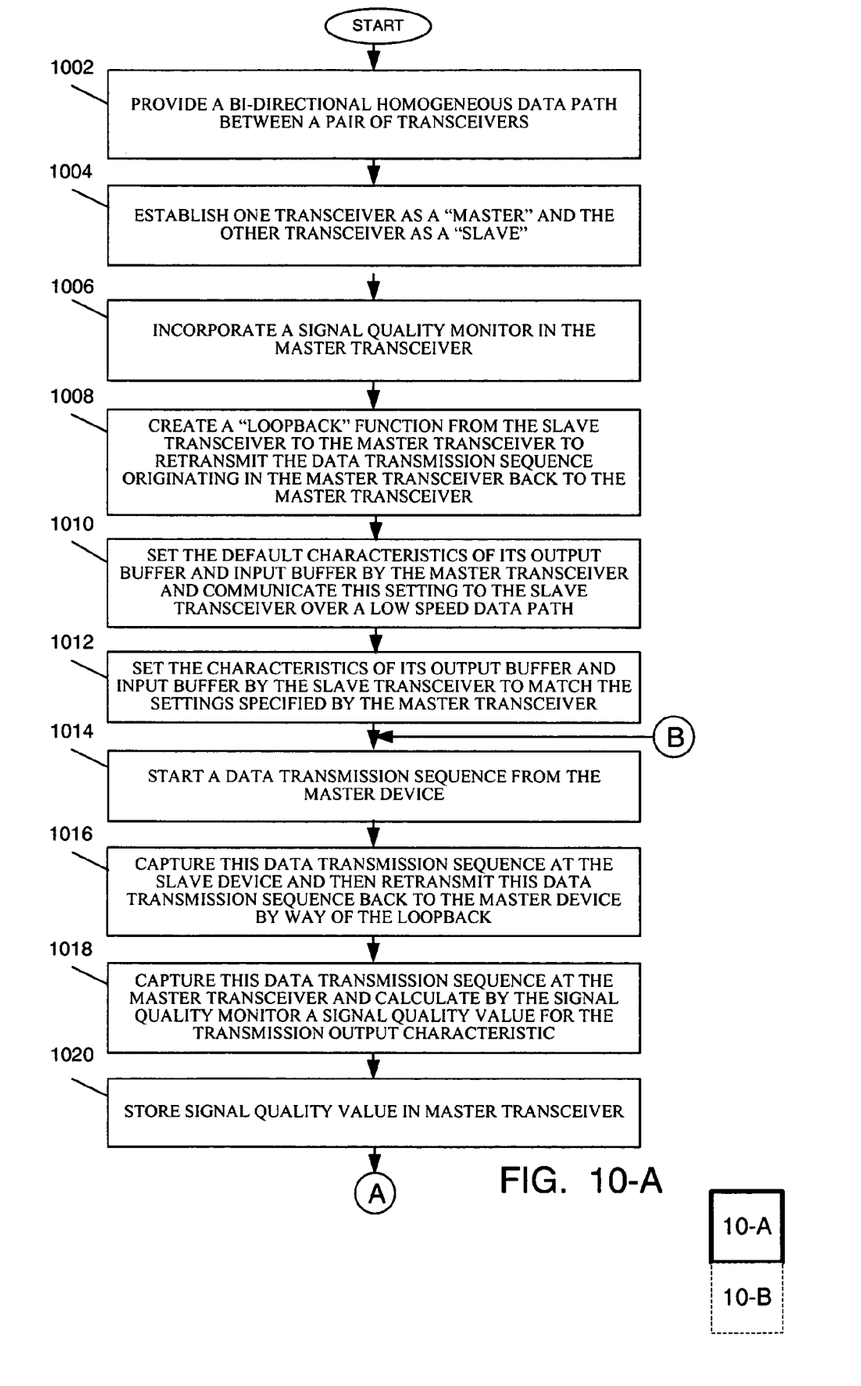
FIG. 10 is a flow chart showing a method of transmitting data between a master transceiver to a slave transceiver on a bi-directional transmission media according to an embodiment of the present invention.

Turning now to FIG. 10, a flow chart shows a method of transmitting data between a master transceiver and a slave transceiver on a bi-directional transmission media according to an embodiment of the present invention. According to the embodiment of FIG. 10, a bi-directional homogeneous data path between a pair of transceivers is provided at a step 1002. One transceiver is established as the "master," and the other transceiver is established as a "slave" at a step 1004. A signal quality monitor is incorporated in the master transceiver at a step 1006. A "loopback" function from the slave transceiver to the master transceiver is created in the slave transceiver. The loopback function enables the retransmission of the data transmission sequence originating in the master transceiver back to the master transceiver at a step 1008. The default characteristics of its output buffer and input buffer are set by the master transceiver and communicated to the slave transceiver over a feedback path, such as a low speed data path, at a step 1010. The characteristics of its output buffer and input buffer are preferably set by the slave transceiver to match the settings specified by the master transceiver, at a step 1012.

A data transmission sequence is started from the master transceiver at a step 1014. The data transmission sequence is captured at the slave transceiver and then retransmitted back to the master transceiver by way of the loopback function at a step 1016. The data transmission sequence is captured at the master transceiver and a signal quality value is calculated by the signal quality monitor for the transmission output characteristic at a step 1018. The signal quality value is stored in the master transceiver at a step 1020.

It is then determined whether all of the potential input characteristics of the input buffer are exhausted at a step 1022. If not, the input characteristics of the input buffer of the master transceiver are altered and communicated to the slave transceiver over the feedback path at a step 1024. If all of the potential input characteristics are exhausted, it is then determined if all of the potential output characteristics are exhausted at a step 1026. If not, the characteristics of the output buffer are altered and the characteristics of the output buffer and input buffer are set by the slave transceiver to match the settings specified by the master transceiver at a step 1028, and the slave transceiver requests a new data transmission sequence at a step 1014.

If all of the potential output characteristics are exhausted, all of the stored signal quality values are compared and the combination of input and output characteristics that maximizes the received signal quality is selected at a step 1030. These settings are provided to the slave transceiver over the feedback path at a step 1032. It is also preferably determined whether the signal quality value is adequate at a step 1034. If not, additional data transmission protocols, such as forward error correction, are added to further minimize the received data errors at a step 1036. Finally, it is determined whether current conditions have changed or a predetermined time period has elapsed at a step 1038. The mode of operation of FIG. 10 is similar to that of FIG. 9, except that now the input and output characteristics of the master and slave transceivers are altered simultaneously. A low speed data path is preferably used by the master transceiver to enable the slave transceiver to set the programmable input and output characteristics to be the same as the master transceiver.

Figures 10, 11:
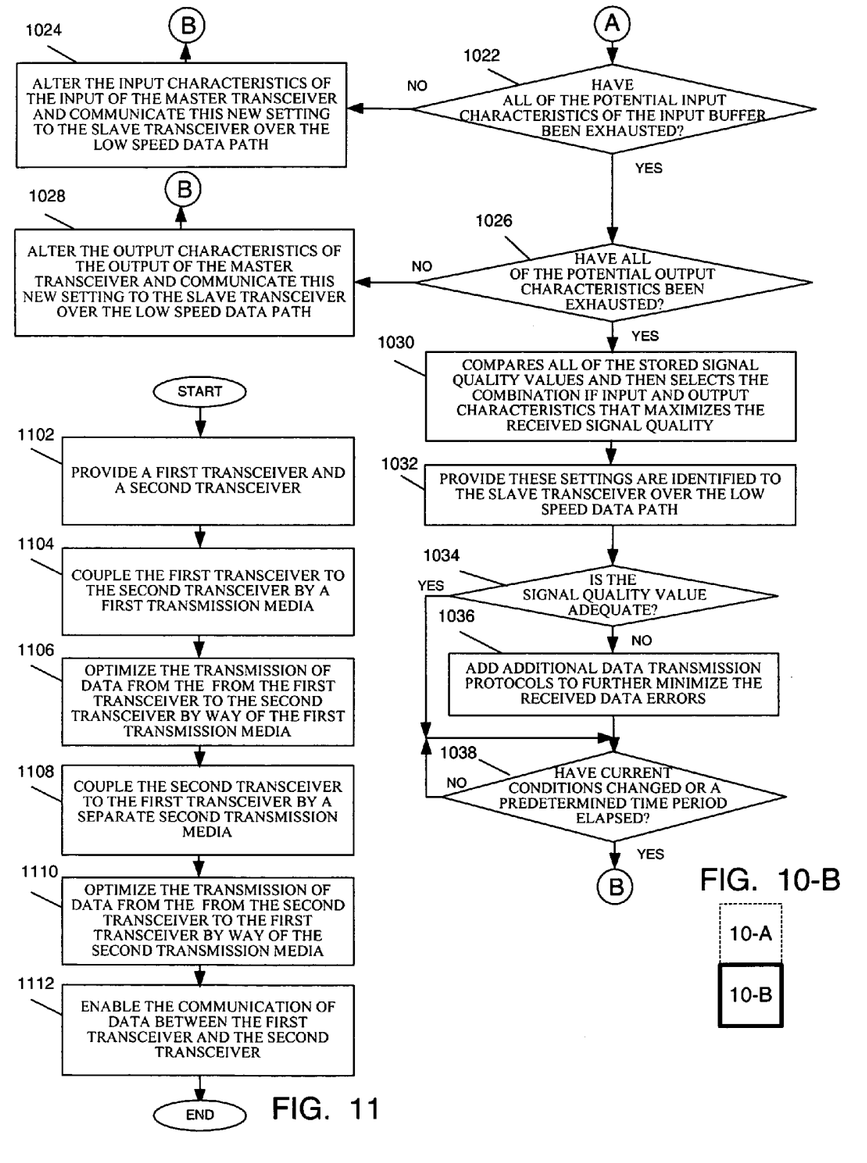
FIG. 11 is flow chart showing a method of transmitting data between a first transceiver and a second transceiver by way of a first and second transmission media according to an embodiment of the present invention.

Turning now to FIG. 11, a flow chart shows a method of transmitting data between a first transceiver and a second transceiver by way of first and second transmission media according to an embodiment of the present invention. A first transceiver and a second transceiver are provided at a step 1102. The first transceiver is coupled to the second transceiver by way of a first transmission medium at a step 1104. The transmission of data from the first transceiver to the second transceiver by way of the first transmission media is optimized at a step 1106. The second transceiver is also coupled to the first transceiver by way of a second transmission medium at a step 1108. The transmission of data from the second transceiver to the first transceiver by way of the second transmission media is optimized at a step 1110. The transmission of data between the first transceiver and the second transceiver could be optimized according to any of the methods of FIG. 7 or 8, for example. Finally, bi-directional communication of data between the first transceiver and the second transceiver is enabled at a step 1112.

Accordingly, the circuits and methods of the present invention provide an automated procedure for the optimization of serial transmission signal quality, without prior knowledge of the channel characteristics, even if the channel characteristics change with time. With the rapid evolution of very high speed IO standards, designers employing circuits such as FPGAs have to handle RF circuit problems at the printed circuit board level, which is a barrier to successful design completion. The circuits and methods of the present invention allow the FPGA to self-tune for optimal performance in a PC board environment, simplifying the board design problem and preserving the traditional FPGA benefits of ease-of-use and time-to-market.

It can therefore be appreciated that the new and novel circuit and method of optimizing the speed of a serial communication channel has been described. It will be appreciated by those skilled in the art that, particular to the teaching herein, numerous alternatives and equivalents will be seen to exist which incorporate the disclosed invention. As a result, the invention is not to be limited by the foregoing embodiments, but only by the following claims.

The invention claimed is:

1. A circuit for optimizing transmission of data on a communication channel, said circuit comprising:
    a transmitter circuit having a programmable output characteristic;
    a transmission media coupled to said transmitter circuit, said transmission media receiving data from said transmitter circuit;
    a receiver circuit coupled to said transmission media to receive said data;
    a signal quality monitor associated with said receiver circuit and generating received signal quality data; and
    a feedback path coupling said received signal quality data to said transmitter circuit,
wherein said receiver circuit comprises an internal loopback circuit.

2. The circuit of claim 1 wherein said receiver circuit comprises programmable input characteristics.

3. The circuit of claim 1 wherein said transmission media comprises a bi-directional transmission media.

4. The circuit of claim 3 wherein said transmitter circuit comprises a second signal quality monitor coupled to said feedback path.

5. A circuit for optimizing transmission of data on a serial communication channel, said circuit comprising:
a transmitter circuit having an output buffer;
a transmission media coupled to said transmitter circuit, said transmission media receiving serial data from said transmitter circuit;
a receiver circuit coupled to said transmission media to receive said serial data, said receiver circuit having a programmable input characteristic;
a signal quality monitor associated with said receiver circuit and generating received signal quality data; and
a feedback path coupling said received signal quality data to said transmitter circuit,
wherein said output buffer has a plurality of programmable output characteristics, and
wherein at least one of said plurality of programmable output characteristics is selected from the group consisting of:
output voltage;
rise and fall times of an output signal; and
pre-emphasis of the output signal.

6. The circuit of claim 5 wherein said feedback path further couples programmable input characteristics from said transmitter circuit to said receiver circuit.

7. The circuit of claim 5 wherein said programmable input characteristic is selected from a group comprising:
a voltage threshold;
variable equalization; and
filtering.

8. The circuit of claim 5 wherein said transmission media comprises a bi-directional transmission media.

9. A circuit for optimizing transmission of data on a serial communication channel, said circuit comprising:
a transmitter circuit having a programmable output characteristic to transmit serial data;
a bi-directional transmission media coupled to said transmitter circuit;
a receiver circuit coupled to said bi-directional transmission media to receive said serial data;
a signal quality monitor associated with said receiver circuit and generating received signal quality data; and
a feedback path coupled between said receiver circuit and said transmitter circuit to provide said received signal quality data to said transmitter circuit, wherein said receiver circuit comprises an internal loopback circuit.

10. The circuit of claim 9 wherein said transmitter circuit comprises a master circuit.

11. The circuit of claim 10 wherein said receiver circuit comprises a slave circuit.

12. The circuit of claim 9 further comprising a second signal quality monitor associated with said transmitter circuit.

13. The circuit of claim 12 wherein said receiver circuit comprises programmable input characteristics.

14. A method of optimizing transmission of data on a serial communication channel, said method comprising the steps of:
transmitting data from a transmitter circuit to a receiver circuit by way of a serial communication channel;
calculating a signal quality value for the transmission of said data from said transmitter circuit to said receiver circuit;
coupling said signal quality value from said receiver circuit to said transmitter circuit by way of a second communication channel;
altering output characteristics of said transmitter circuit based upon said signal quality value; and
altering input characteristics of said receiver circuit based upon said signal quality value,
wherein the transmission of said data from said transmitter circuit to said receiver circuit is performed via a printed circuit board.

15. The method of claim 14 further comprising a step of repeating the step of altering the output characteristics of said transmitter circuit until an optimum output transmission characteristic is determined.

16. The method of claim 15 further comprising a step of repeating the step of altering the input characteristics of said receiver circuit until an optimum input transmission characteristic is established.

17. The method of claim 14 further comprising a step of calculating a second signal quality value for the transmission of data from said receiver circuit to said transmitter circuit.

18. The method of claim 17 further comprising a step of coupling the second signal quality value from the transmitter circuit to the receiver circuit by way of said second communication channel.

19. A method of optimizing transmission of data on a serial communication channel, said method comprising the steps of:
transmitting data from a first transceiver circuit to a second transceiver circuit by way of a bi-directional serial communication channel;
calculating a signal quality value for the transmission of said data;
coupling said signal quality value from said second transceiver circuit to said first transceiver circuit by way of a second communication channel;
altering output characteristics of said first transceiver circuit based upon said signal quality value; and
altering output characteristics of said second transceiver circuit based upon said signal quality value.

20. The method of claim 19 wherein said step of transmitting data from a first transceiver circuit to a second transceiver circuit comprises a step of transmitting data from said first transceiver circuit acting as a master.

21. The method of claim 20 further comprises a step of receiving data at said second transceiver circuit acting as a slave.

22. The method of claim 21 further comprising a step of determining an optimum output transmission characteristic.

23. The method of claim 22 wherein said step of altering the output characteristics of said second transceiver circuit comprises transmitting data by way of said bi-directional serial communication channel using said optimum output characteristic.

24. A method of optimizing transmission of data on a serial communication channel, said method comprising the steps of:
transmitting first data from a first transceiver circuit to a second transceiver circuit by way of a first serial communication channel;
calculating a signal quality value for the transmission of said first data;
coupling the signal quality value from said second transceiver circuit to said first transceiver circuit by way of a second communication channel;
altering output characteristics of said first transceiver circuit based upon said signal quality value;

transmitting second data from said second transceiver circuit to a first transceiver circuit by way of a second serial communication channel;

calculating a second signal quality value for the transmission of said second data;

coupling said second signal quality value from said first transceiver circuit to said second transceiver circuit by way of said second communication channel; and altering output characteristics of said second transceiver circuit based upon said second signal quality value.

25. The method of claim 24 wherein said step of altering the output characteristics of said first transceiver circuit comprises a step of repeatedly altering the output characteristics of said first transceiver circuit until a first optimal transmission characteristic is reached.

26. The method of claim 25 further comprising a step of altering the input characteristics of said second transceiver circuit.

27. The method of claim 24 wherein said step of altering the output characteristics of said second transceiver circuit comprises a step of repeatedly altering said output characteristics of the second transceiver circuit until a second optimal transmission characteristic is reached.

28. The method of claim 27 further comprising a step of altering the input characteristics of said first transceiver circuit.

29. A circuit for optimizing transmission of data on a serial communication channel, said circuit comprising:

a transmitter circuit having an output buffer;

a transmission media coupled to said transmitter circuit, said transmission media receiving serial data from said transmitter circuit;

a receiver circuit coupled to said transmission media to receive said serial data, said receiver circuit having a programmable input characteristic;

a signal quality monitor associated with said receiver circuit and generating received signal quality data; and a feedback path coupling said received signal quality data to said transmitter circuit, wherein said output buffer has a plurality of programmable output characteristics; and wherein said programmable input characteristic is selected from a group comprising:

a voltage threshold;

variable equalization; and filtering.

30. The circuit of claim 29 wherein said feedback path further couples programmable input characteristics from said transmitter circuit to said receiver circuit.

31. The circuit of claim 29 wherein said transmission media comprises a bi-directional transmission media.

* * * * *